(12) United States Patent
Ungar

(10) Patent No.: US 8,442,084 B2
(45) Date of Patent: May 14, 2013

(54) HIGH PERFORMANCE VERTICALLY EMITTING LASERS

(75) Inventor: Jeffrey E. Ungar, Valley Village, CA (US)

(73) Assignee: Laser Operations LLC, Monsey, NY (US)

( * ) Notice: Subject to any disclaimer, the term of this patent is extended or adjusted under 35 U.S.C. 154(b) by 2442 days.

(21) Appl. No.: 10/264,534

(22) Filed: Oct. 3, 2002

(65) Prior Publication Data

US 2004/0066817 A1 Apr. 8, 2004

(51) Int. Cl.
*H01S 5/00* (2006.01)

(52) U.S. Cl.
USPC .............. 372/44.011; 372/43.01; 372/50.1; 372/96; 372/99; 372/102; 372/107; 372/50.124

(58) Field of Classification Search ........... 372/43–50.1, 372/99, 102, 92, 96, 107; 257/777, 50.124
See application file for complete search history.

(56) References Cited

U.S. PATENT DOCUMENTS

| | | | |
|---|---|---|---|
| 3,996,528 A * | 12/1976 | Blum et al. ............ 372/93 |
| 4,163,953 A * | 8/1979 | Springthorpe et al. .... 372/45.01 |
| 4,807,238 A | 2/1989 | Yokomori |
| 4,956,844 A | 9/1990 | Goodhue et al. |
| 5,033,054 A | 7/1991 | Scifres et al. |
| 5,212,707 A | 5/1993 | Heidel et al. |
| 5,314,838 A | 5/1994 | Cho et al. |
| 5,331,659 A | 7/1994 | Ohata et al. |
| 5,608,233 A * | 3/1997 | Sahara et al. ............ 257/80 |
| 5,627,851 A * | 5/1997 | Takahashi ............ 372/44 |
| 5,671,243 A | 9/1997 | Yap |
| 5,793,785 A | 8/1998 | Nakanishi et al. |
| 6,195,374 B1 * | 2/2001 | Kidoguchi et al. ...... 372/45.013 |
| 6,267,515 B1 * | 7/2001 | Okuda et al. ............ 385/88 |
| 6,393,169 B1 * | 5/2002 | Paniccia et al. .......... 385/14 |
| 6,459,716 B1 * | 10/2002 | Lo et al. ................ 372/50.1 |
| 6,487,224 B1 | 11/2002 | Ohashi et al. |
| 6,520,778 B1 * | 2/2003 | Eldridge et al. .......... 439/66 |

(Continued)

FOREIGN PATENT DOCUMENTS

| | | |
|---|---|---|
| DE | 19520 998 C1 | 8/1996 |
| EP | 0 786 840 A1 | 7/1997 |
| JP | 60 124983 A | 7/1985 |
| JP | 2000114655 A | 4/2000 |

OTHER PUBLICATIONS

Yoshikawa et al., "Laser-Detector-Hologram Unit for Thin Optical Pick-up Head of a CD Player", 1995 IEEE, pp. 245.

*Primary Examiner* — Jessica Stultz
*Assistant Examiner* — Delma R Forde
(74) *Attorney, Agent, or Firm* — Ben J. Yorks; Irell & Manella LLP

(57) ABSTRACT

A semiconductor laser that has a reflective surface. The reflective surface redirects the light of an edge emitting laser diode to emit from the top or bottom surface of the diode. The laser may include a gain layer and a feedback layer located within a semiconductive die. The gain and feedback layers generate a laser beam that travels parallel to the surface of the die. The reflective surface reflects the laser beam 90 degrees so that the beam emits the die from the top or bottom surface. The reflective surface can be formed by etching a vicinally oriented III-V semiconductive die so that the reflective surface extends along a (111)A crystalline plane of the die.

9 Claims, 2 Drawing Sheets

U.S. PATENT DOCUMENTS 6,587,605 B2 * 7/2003 Paniccia et al. ................. 385/14
6,597,721 B1 * 7/2003 Hutchinson et al. ............ 372/98
6,611,546 B1 * 8/2003 Garnache et al. ............... 372/92
2003/0099273 A1 * 5/2003 Murry et al. .................. 372/108

* cited by examiner

US 8,442,084 B2

HIGH PERFORMANCE VERTICALLY EMITTING LASERS

BACKGROUND OF THE INVENTION

1. Field of the Invention

The subject matter disclosed generally relates to the field of semiconductor lasers.

2. Background Information

Semiconductor lasers are used in a variety of system applications. For example, semiconductor lasers are used as a light source in fiber optic communication systems. Laser diodes emit a laser beam from either the edge of the diode die or the surface of the die. Commercially available surface emitting dies contain a vertical cavity and are commonly referred to as Vertical Cavity Surface Emitting Lasers (VCSELs).

Because edge emitting diodes emit the beam from the edge of the semiconductive die, each die must be cut from the wafer before being tested. Conversely, VCSELs, being surface emitting, can be tested in wafer form. Testing at the wafer level reduces the cost associated with testing the laser diodes.

Unfortunately, VCSELs emit a relatively low power laser beam. Consequently, the use of VCSELs has been limited to short optical links. Additionally, most commercially available VCSELs emit light at 850 nanometers (nm). Fiber optic cables strongly disperse and absorb 850 nm light. Edge emitting diodes can generate light at 1310 or 1550 nm which are less affected by absorption and dispersion within a fiber cable.

There have been attempts to integrate internal mirrors within an edge emitting laser diode so that the laser beam emits from the top surface of the diode. For example, ion-beam milling processes have been used to form inclined reflective mirrors within an edge emitting diode. Ion-milling is a relatively inaccurate process that produces rough reflective surfaces. Consequently, such an approach does not have a commercial application.

BRIEF SUMMARY OF THE INVENTION

A semiconductor laser diode that includes a gain layer and a diffraction grating feedback layer within a semiconductive die. The semiconductive die also includes a reflective surface located along a (111)A cystalline plane of the die. The reflective surface reflects a laser beam generated within the semiconductive die so that the beam is emitted from a surface of the die.

DETAILED DESCRIPTION

Disclosed is a semiconductor laser that has an inclined reflective surface. The reflective surface redirects the light of an edge emitting laser diode to emit from a surface of the laser diode. The laser includes a gain layer and a diffraction grating feedback layer located within a semiconductive die. The gain and feedback layers generate a laser beam that travels parallel to the surface of the die. The reflective surface reflects the laser beam 90 degrees so that the beam emits the die from the top or bottom surface. The reflective surface can be formed by etching a vicinally oriented III-V semiconductive die so that the reflecting surface extends along a (111)A crystalline plane of the die.

Figure 1:
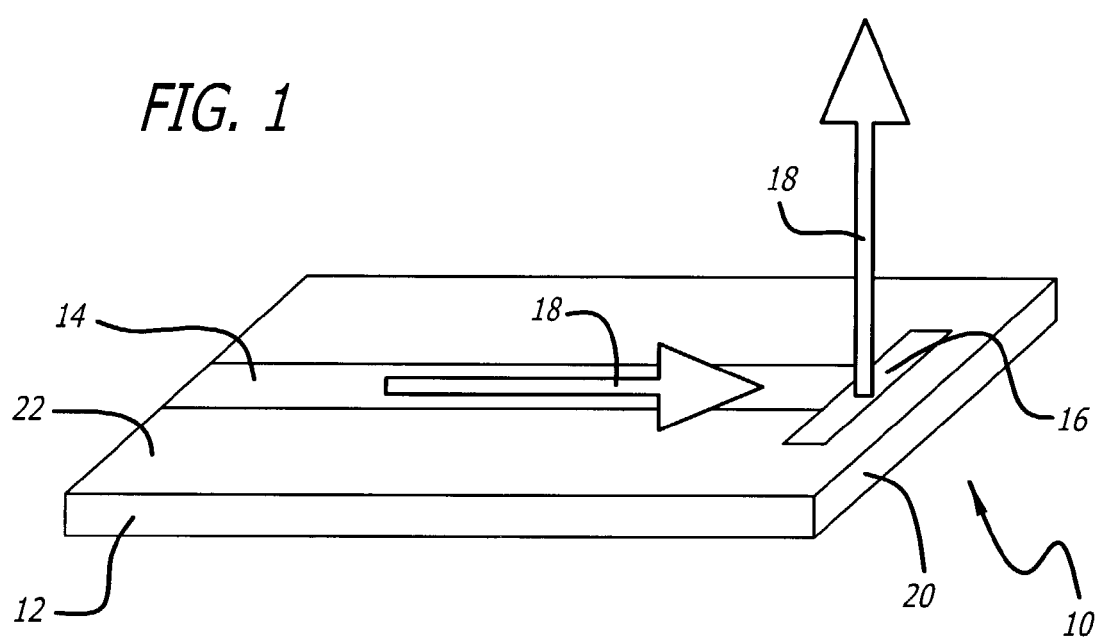
FIGS. 1 is an illustration showing a perspective of a semiconductor laser.
Figure 2:
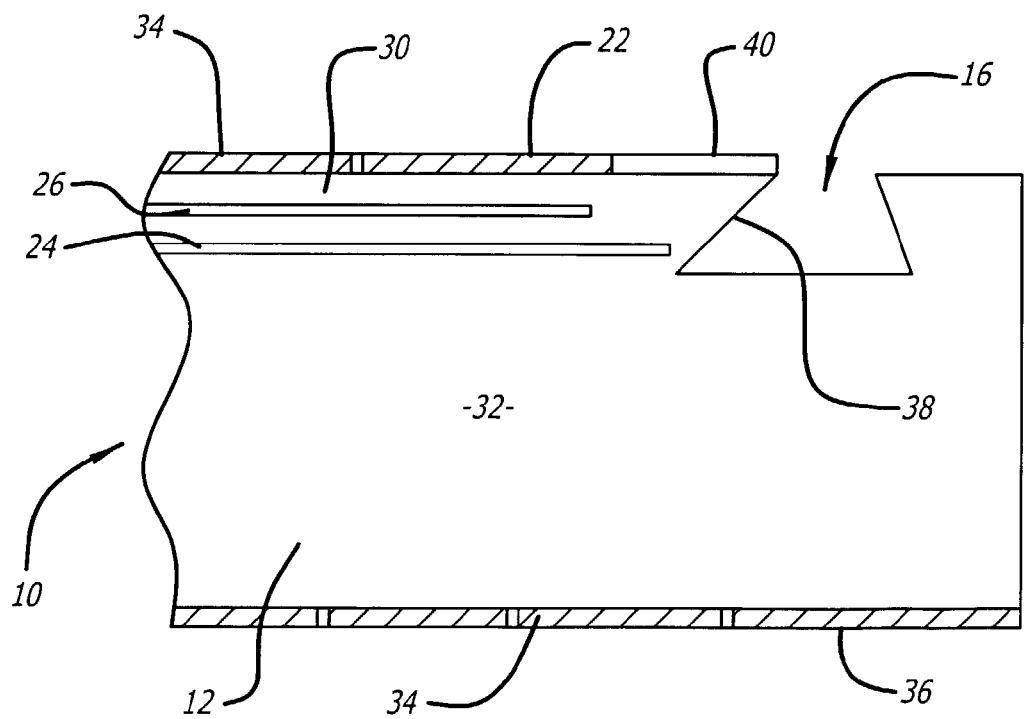
FIG. 2 is an illustration showing a side sectional view of the semiconductor laser.

FIGS. 1 and 2 refer specifically to an embodiment where the beam emits from a top surface, but by reversing the inclination of the reflecting surface in an obvious fashion, the beam can emit from the bottom surface, if so desired. In the event that the substrate is opaque to the generated laser light, the substrate material located directly below the deflection mirror can be chemically removed by processes well known in the art. Any reference to a "surface" that emits a beam will include the top or bottom surfaces of the die.

Referring to the drawings more particularly by reference numbers, FIG. 1 shows a semiconductor laser 10. The semiconductor laser 10 is fabricated as a semiconductive die 12 that contains a laser strip 14 and a reflective element 16. The laser strip 14 generates a laser beam 18 that travels toward an edge 20 of the die 12. The reflective element 16 reflects the laser beam 18 so that the beam 18 is emitted from a top surface 22 of the die 12.

As shown in FIG. 2 the semiconductor laser 10 includes a gain layer 24 and a diffraction grating feedback layer 26. The gain layer 24 located between a P-type layer 30 and a N-type substrate 32 to provide the optical gain required for oscillation. Electrical contacts 34 may be located at the top surface 22 and a bottom surface 36 of the die 12. The contacts 34 are connected to a source of electrical power that induces a migration of holes and electrons from the layers 32 and 30 to the gain layer 24. The holes and electrons recombine and emit photons.

The diffraction grating feedback layer 26, which is composed of a semiconductor alloy differing in refractive index from the P-type layer 30, is corrugated with a period satisfying the Bragg condition for the desired frequency of oscillation. Layer 26 may extend along the entire length of the laser, in which case it forms a distributed feedback laser, or it may extend over part of the length, in which case it forms a distributed Bragg reflector laser.

The reflective element 16 may include a reflective surface 38 that can reflect the laser through an exit facet 40 in the top surface 22 of the die 12. The facet 40 may have an anti-reflection coating. The reflective surface 38 is formed at a 45 degree angle relative to the top surface 22. The 45 degree angle will deflect the laser beam 90 degrees so that the laser exits the die 12 perpendicular to the top surface 22.

The semiconductive die 12 can be epitaxially grown on an indium-phosphide, gallium-arsenide or other III-V semiconducting substrate. The (111)A crystalline plane of these and other III-V semiconductors are more thermodynamically stable than planes of different direction. Consequently, chemically etching such materials leaves an exposed surface along the (111)A crystalline plane.

Figure 3:
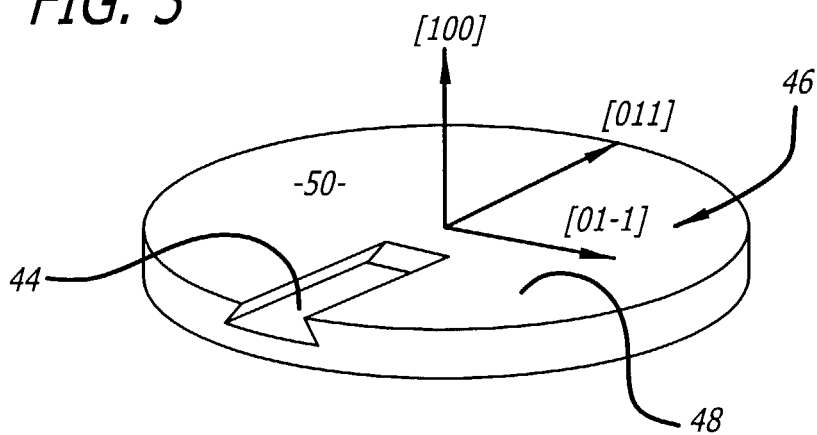
FIG. 3 is an illustration showing a perspective view of a wafer with a mask.
Figure 4:
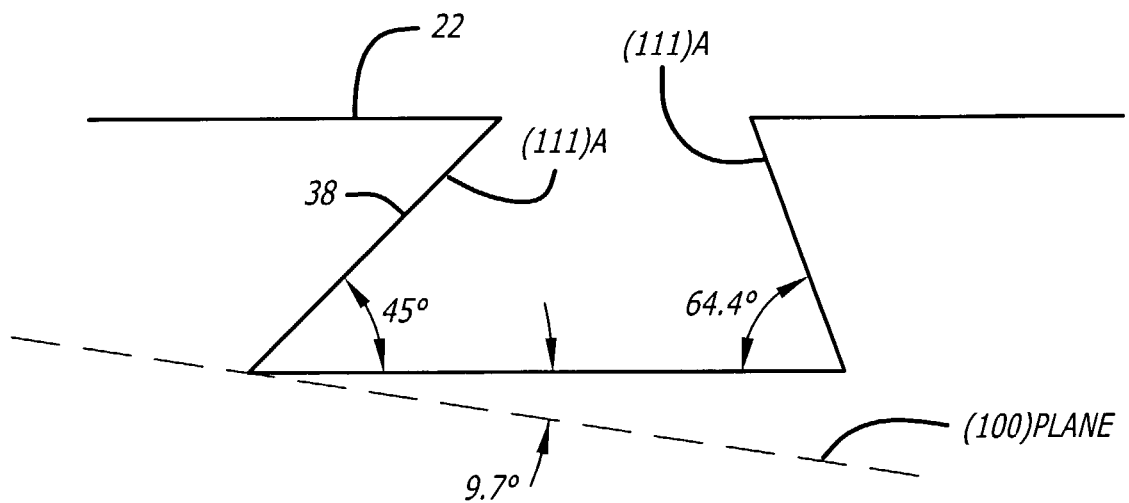
FIG. 4 is an enlarged view of an etched reflective surface of the laser shown in FIG. 2.

As shown in FIG. 3, if surface 50 of a conventionally (100) oriented III-V semiconducting wafer 46 is protected by chemically resistant mask 48, except for the region of exposed [011] oriented slot 44, and is typically etched with a chlorine or bromine based etchant, an overhanging "dovetail" shaped groove is formed. The resulting groove's sidewalls are (111)A surfaces, which are inclined by 54.7 degrees to the surface, and are not suitable for use as a 45 degree deflection mirror. If, as shown in FIG. 4, a vicinally oriented substrate 22 that is inclined by 9.7 degrees from the (100) direction towards the [111] direction is used instead of a conventional (100) oriented substrate, the resulting (111)A sidewall 38 is inclined to the surface by 45 degrees. This sidewall is suitable for use as a 90 degree deflection mirror.

The result is a repeatable process to form a 45 degree reflective surface within the die. Additionally, the etching process creates a relatively smooth reflective surface 38.

Typically, a large number of individual laser dice 12 will be fabricated in parallel on a single wafer, which is then cut into individual lasers.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. In particular, an essentially equivalent laser could be made if the conductivity types of P-doped and N-doped layers are reversed, if the positions of active layer 28 and distributed feedback layers 26 are reversed, or if the inclination of deflection mirror 38 is reversed so that the beam exits through the substrate rather than the surface.

What is claimed is:

1. A semiconductor laser, comprising:
    a semiconductive die that has a top surface and includes a laser strip, said laser strip including;
        a gain layer;
        a diffraction grating feedback layer that together with said gain layer create a laser beam; and,
        a reflective surface located on a (111)A crystalline plane of said semiconductive die and located at a 45 degree angle relative to said top surface, said reflective surface reflects said laser beam to exit said top surface.

2. The semiconductor laser of claim 1, wherein said semiconductive die is fabricated from III-V compound semiconducting crystals.

3. The semiconductor laser of claim 1, wherein a top surface of said semiconductive die is located at an angle relative to a (100) crystalline plane of said semiconductive die.

4. The semiconductor laser of claim 1, wherein said semiconductive die includes an exit facet.

5. The semiconductor laser of claim 1, wherein said reflective surface is located along a groove that extends across a portion of a top surface of said semiconductive die.

6. A method for operating a semiconductor laser, comprising:
    generating a laser beam in a laser strip located within a semiconductive die, the semiconductive die having a top surface; and,
    reflecting the laser beam from a reflective surface of a semiconductor die 90 degrees so that the laser beam exits the top surface of the semiconductor die, the reflective surface being located in the laser strip and on a (111)A crystalline plane of the semiconductive die at a 45 degree angle relative to the top surface.

7. A method for fabricating a semiconductor laser, comprising:
    forming a mask on a top surface of a semiconductive wafer such that there is an unmasked portion of the semiconductive wafer;
    etching the unmasked portion of the semiconductive wafer to create a reflective surface that extends on a (111)A crystalline plane of the semiconductive wafer and is located at a 45 degree angle relative to the top surface; and,
    cutting a semiconductive die from the semiconductive wafer.

8. The method of claim 7, wherein the semiconductive wafer is fabricated with III-V compound semiconducting crystals.

9. The method of claim 7, further comprising cutting the semiconductive wafer so that a top surface of the semiconductive wafer is located at an angle relative to a (100) crystalline plane of the semiconductive wafer.

* * * * *